United States Patent
Kang

(10) Patent No.: US 11,410,718 B2
(45) Date of Patent: Aug. 9, 2022

(54) SYSTEMS AND METHODS FOR COMMON GATE INPUT BUFFERS

(71) Applicant: Micron Technology, Inc., Boise, ID (US)

(72) Inventor: Shin Deok Kang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/139,260

(22) Filed: Dec. 31, 2020

(65) Prior Publication Data

US 2022/0208253 A1    Jun. 30, 2022

(51) Int. Cl.
*G11C 7/10* (2006.01)
*G11C 11/4093* (2006.01)

(52) U.S. Cl.
CPC ............................... *G11C 11/4093* (2013.01)

(58) Field of Classification Search
CPC .................................................. G11C 11/4093
See application file for complete search history.

(56) References Cited

U.S. PATENT DOCUMENTS

| | | | | |
|---|---|---|---|---|
| 2014/0167821 A1* | 6/2014 | Yang | ................... | H03F 3/45197 327/108 |
| 2014/0269130 A1* | 9/2014 | Maeng | ................. | G11C 7/1084 365/207 |

OTHER PUBLICATIONS

Wilson et. al., 'Ground-Referenced Single-Ended Signaling,' 10.1109/MSSC.2019.2910618, Jun. 24, 2019, IEEE Solid-State Circuits Magazine, pp. 1-15 (Year: 2019).*
Turner et. al., 'Ground-Referenced Signaling for Intra-Chip and Short-Reach Chip-to-Chip Interconnects,' NVIDIA, Durham, NC, NVIDIA, Santa Clara, CA, University of Florida, Gainesville, FL, Now with Broadcom, Irvine, CA, 2018 IEEE, pp. 1-8.
Wilson et. al., 'Ground-Referenced Single-Ended Signaling,' 10.1109/MSSC.2019.2910618, Jun. 24, 2019, IEEE Solid-State Circuits Magazine, pp. 1-15.

* cited by examiner

*Primary Examiner* — Min Huang
(74) *Attorney, Agent, or Firm* — Fletcher Yoder, P.C.

(57) ABSTRACT

A memory device includes a common gate input buffer circuit. The input buffer circuit includes an input node configured to receive a signal representative of data to be stored in the memory device and a voltage reference node. The input buffer circuit further includes an amplification circuit electrically coupled to the input node and to the voltage reference node and configured to amplify the signal to provide for an amplified signal. The input buffer circuit additionally includes an equalization circuit electrically coupled to the amplification circuit and configured to process the amplified signal to provide for a filtered signal and an output circuit electrically coupled to equalization circuit and configured to provide for at least one output signal based on the filtered signal, wherein the output signal comprises a differential output signal and wherein the common gate input buffer circuit does not include a common mode feedback (CMFB) loop.

19 Claims, 4 Drawing Sheets

SYSTEMS AND METHODS FOR COMMON GATE INPUT BUFFERS

BACKGROUND

Field of the Present Disclosure

The present disclosure relates to input buffers, and more specifically, to common gate input buffers.

Description of Related Art

Certain read/write memory devices, such as dynamic random access memory (DRAM), include arrays having memory cells that store information. For example, certain DRAM devices, such as synchronous dynamic RAM (SDRAM) devices, may have multiple memory banks having many addressable memory elements or cells included in memory arrays. In use, memory devices, as the SDRAM devices may receive data input signals at high speeds, such as speeds of 6 gigabits per second (Gbps) (e.g., 6 Gbps, 7 Gbps, 8 Gbps) or more, and store data in the memory cells based on the data input signals. Input buffers, such as common gate input buffers, may be used to receive high speed data and to store the received data for further processing, for example, for conversion into binary bit data or other non-binary data. By processing the signals via input buffer techniques, the input buffers may provide for more efficient communication with external devices. It may be useful to improve systems and methods that incorporate common gate input buffer techniques.

Embodiments of the present disclosure may be directed to one or more of the problems set forth above.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electrical devices may include random access memory (RAM) devices coupled to processing circuitry, and the memory devices may provide storage for data processing. Examples of RAM devices include dynamic RAM (DRAM) devices and synchronous DRAM (SDRAM) devices, which may store individual bits electronically. The stored bits may be organized into addressable memory elements (e.g., words), which may be stored in memory banks. To receive and to transmit the bits, the RAM devices may include certain data communications circuitry as well as communication lines useful in saving and retrieving the bits from the memory bank. In certain DRAM and SDRAM devices, input buffers may be used to store data that may be transmitted at high speeds, such as speeds in excess of 6 Gbps.

In certain embodiments, the input buffers described herein may be disposed in ground referenced signaling (GRS) receivers that may be included, for example, in certain memory devices and suitable for receiving data transmitted from GRS transmitters over a communications channel. In GRS systems, ground may be the one and only signal return network, which may provide for a high-quality termination at both ends of a communication link by removing a power delivery network (PDN) from return paths. That is, ground may be used as the only signal reference voltage from which transmitted voltages may be compared to derive, for example, a logic 1 or logic 0 data. In certain embodiments, the input buffers or receivers may be pseudo differential common gate input buffers that convert a single-ended signal into differential output, as further described below. In certain embodiments, the pseudo differential common gate input buffers may include a common mode feedback (CMFB) structure or loop, while in other embodiments, the CMFB structure or loop may be removed. Accordingly, signal processing at higher rates of speed (e.g., over 6 Gbps) may be improved.

Figure 1:
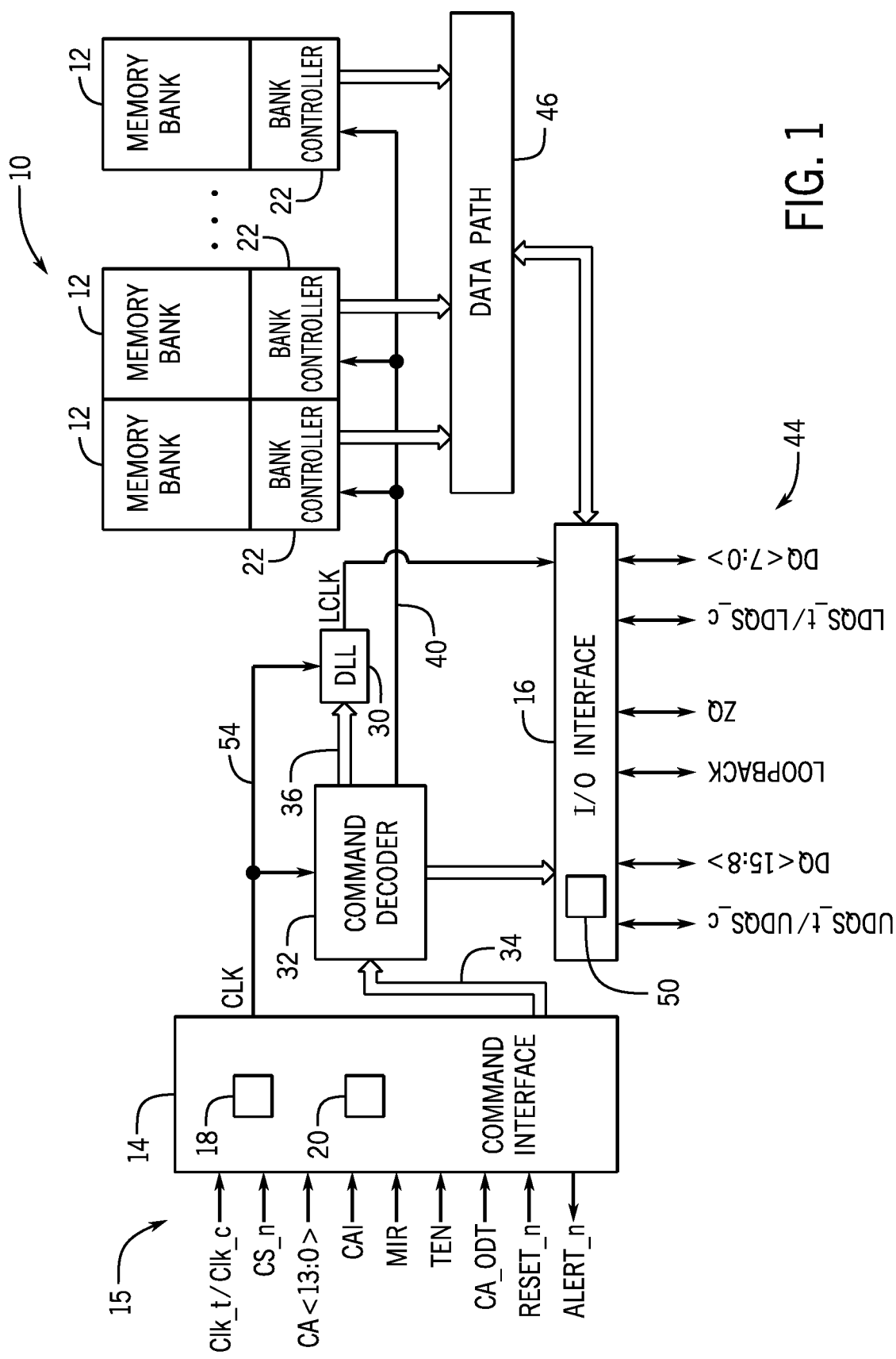
FIG. 1 is a block diagram illustrating an organization of a memory device that may include one or more common gate input buffers, in accordance with an embodiment.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM as further described herein allow for reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command (WrCmd), etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface 14 may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data for read and write commands may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance. The data (e.g., IO signals) for read and writes may be addressed to certain memory (e.g., memory cells) in the memory banks 12.

The techniques described herein provide for a communications system 50 that may process input signals (e.g., DQ<15:8> and DQ<7:0>) communicated via the I/O interface 16. The communications system 50 may include a receiver system (e.g., ground referenced signaling (GRS) receiver system) that may use VSS termination (in the case of LPDDR5) or a receiver system that uses VDDQ termination (in the case of DDR5), which may in turn include one or more common gate (CG) input buffers, such as pseudo differential common gate input buffers, suitable for amplifying incoming signals received via a communications channel for further conversion into logic data (e.g., logic high and logic low data), as further described below. The CG input buffers may include an improved common source structure that may use input and voltage reference (vref) combinations as further described below to maintain a more stable current, thus improving process, voltage, temperature (PVT) conditions and reducing duty cycle offset, which in turn may improve operations at higher speeds.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. In the case of VSS termination ZQ may be connected to VDDQ power. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16. As will be appreciated, various other components such as power supply circuits (for receiving external VDD and VSS signals), mode registers (to define various modes of programmable operations and configurations), temperature sensors (for sensing temperatures of the memory device 10), etc., may also be incorporated into the memory system 10.

Figure 2:
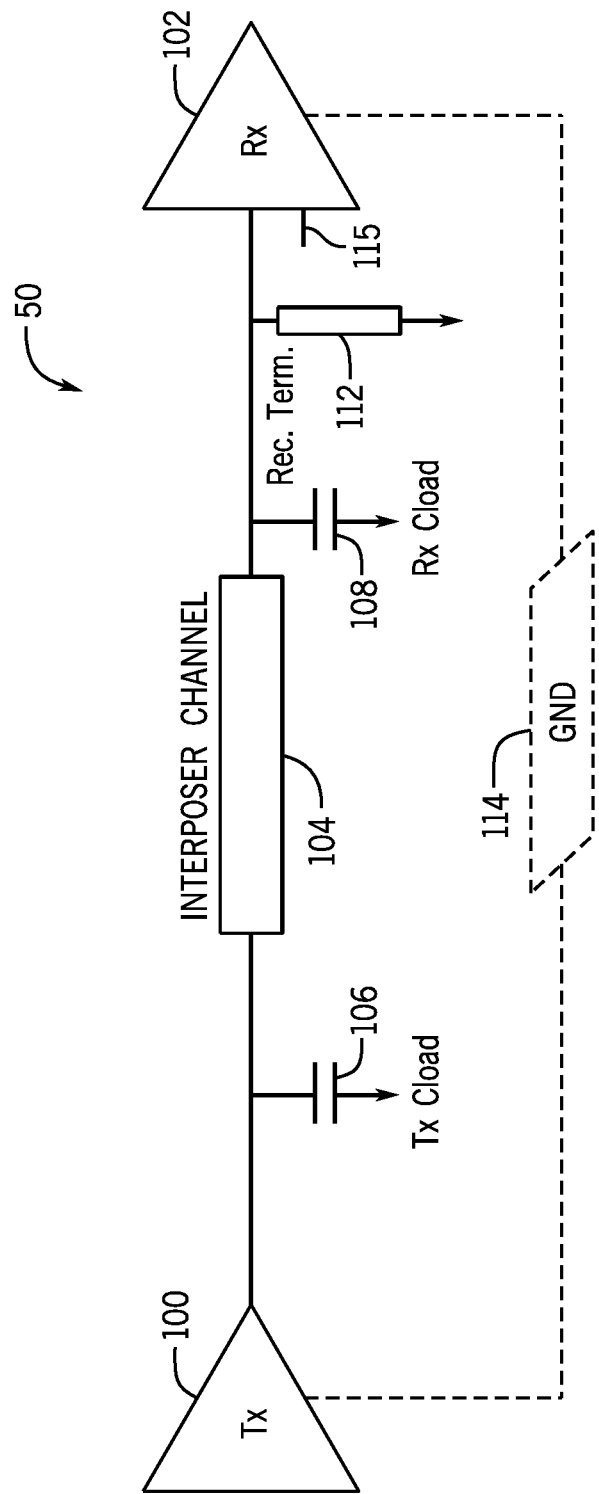
FIG. 2 is a block diagram of a communications system that may be used in the memory device of FIG. 1, in accordance with an embodiment.

It would be beneficial to illustrate an embodiment of the communications system 50. Accordingly, FIG. 2 depicts an embodiment of the communications system 50 having a transmitter 100 communicatively coupled to a receiver 102 via a communications channel 104. It is to be understood that the depicted embodiment is a simplified example only, useful for illustration, and that other communication systems 50 may include more or less components and/or connections. In certain embodiments, the communications system 50 may be an on-package chip-to-chip communications system that may be used, for example, to interface between the memory device 10 and a processor, a field programmable gate array (FPGA), a graphics processing unit (GPU), a specialized chip, and so on. In other embodiments, the communications system 50 may be an on-chip communications system, such as an on-chip serial link system, suitable for communicating between, for example, one or more cores and memory systems (e.g., system 10).

The transmitter 100 may be a VSS terminated signaling transmitter or a ground referenced signaling (GRS) transmitter (e.g., using ground as a reference voltage) from which transmitted signals may then be compared to in order to derive data such as logic low and/or logic high data. In certain embodiments, the communications channel 104 may be an interposer channel, such as a silicon (Si) interposer channel that uses a silicon substrate as a communications media in high density and/or 3-dimensional (3D) packages into the receiver. 102. The receiver 102 may be a pseudo differential receiver that uses Vref as a reference voltage or a GRS receiver that also uses ground as a reference voltage from which to compare with incoming signals for conversion of the signals into logic low and/or logic high data or into non-binary data. The communications system 50 may include certain transmit (Tx) and receive (Rx) capacitance loads 106, 108 that may vary in values based on the type of communications channel 104 used. An input line termination resistor 112 is also shown, which may be used to minimize reflections or "ghosts", for example, in the communications channel 104.

When the communications system 50 includes the use of GRS techniques such as pseudo differential common gate input buffers, a ground loop 114 may be used, suitable for providing for a single ground reference for both the GRS transmitter 100 and the GRS receiver 102. In certain embodiments, the ground reference may be used for a center or middle voltage reference such that a waveform peak may be derived by sensing signals above the ground reference and a waveform trough may be derived by sensing signals below the ground reference. It is to be noted that the ground loop 114 may be connected to any number of components of the receiver 102, including the input line termination resistor 112. When the communication system 50 includes the use of DDR5, DDR5 uses VDDQ termination, while LPDDR5 uses VSS termination. In one example, in the case of VSS termination, Vil=VSS, Vih=200 mV and in the case of VDDQ termination, Vil=VDDQ-200 mV, Vih=VDDQ). VSS termination may thus be used as well as VDDQ termination. If VDDQ termination is desired, the circuit may reverse VDDQ/VSS and reverse the NMOS and PMOS.

Also, the communications system 50 is designed to receive a Vref signal. Of course, it can be used as a GRS input buffer if it is set as VSS without connecting the Vref signal. If Vref is used, it is not necessary to connect a termination resistor. This is because the Vref signal acts as a reference and maintains the common mode well. But if Vref is not connected, a termination resistor is required on the VSS side. If there is no Vref signal, a suitable termination resistor should be placed on the VSS side to make the common mode well formed. Therefore, it would be good to explain two cases.

The receiver 102 may be or may include input buffer circuitry (e.g., pseudo differential common gate input buffer circuitry) to provide certain functions suitable for deciphering the data communicated via the communications channel 104. For example, the receiver 102 may provide for a gain for signal pre-amplification, provide for a level shift of an input waveform (e.g., raise and/or lower the voltage of input signals by a set amount), and/or provide for compensation for high frequency (e.g., frequencies over 6 Gbs) communications channel 104 attenuation. The techniques described herein include common-gate input buffer circuits, as further described below, that enable the receiver 102 to more efficiently provide for one or more of the aforementioned functions in a more efficient and robust manner, thus improving process, voltage, temperature (PVT) conditions and reducing duty cycle offset, which in turn may improve operations at higher speeds.

Figure 3:
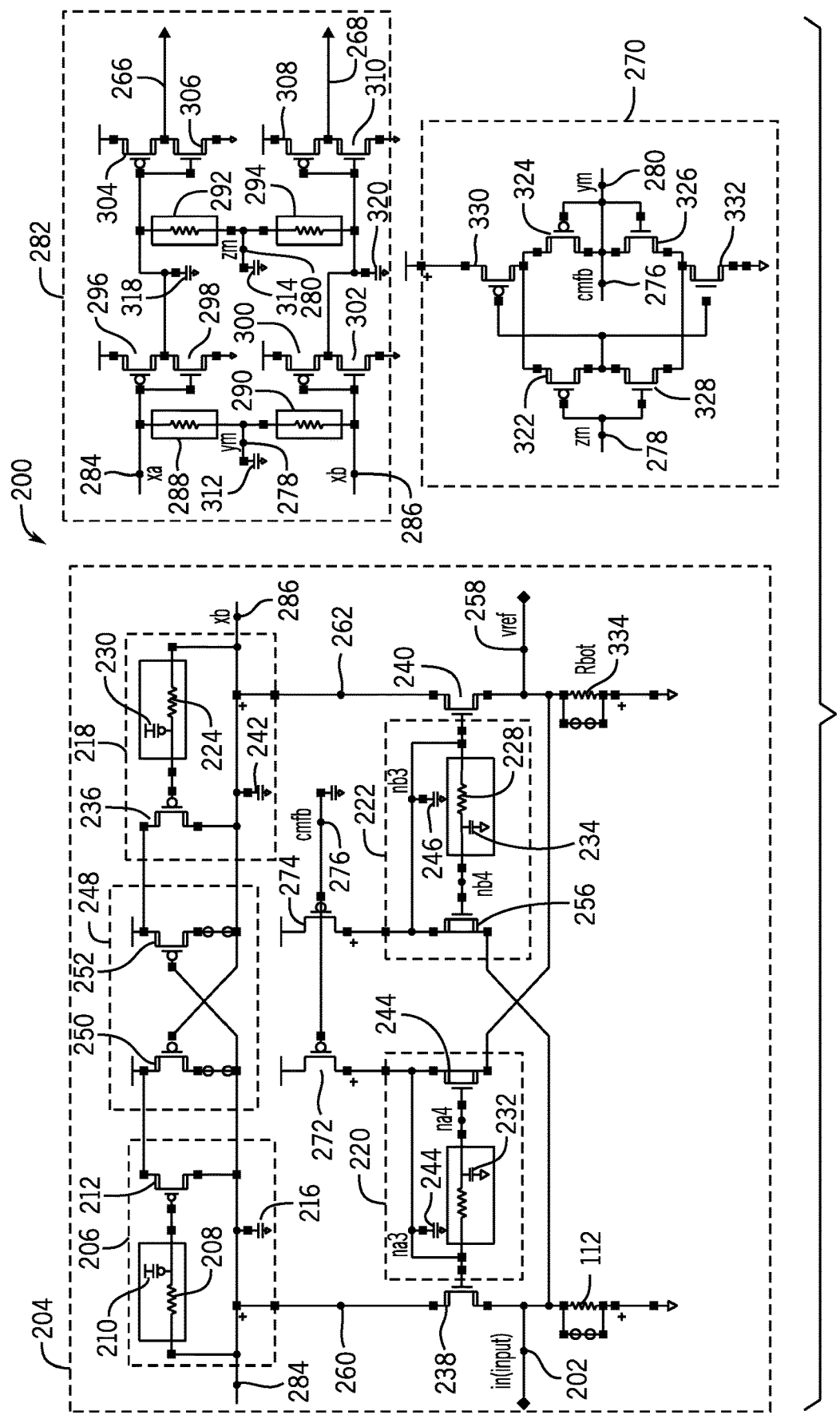
FIG. 3 is a circuit diagram of a pseudo-differential common gate input buffer, in accordance with an embodiment.

FIG. 3 is a schematic diagram illustrating an embodiment of pseudo-differential common gate input buffer circuitry 200 that may be included in the receiver 102. The pseudo differential common gate input buffer circuitry 200 may be used to convert from single-ended to differential signals, for example, by converting a single input signal into two output signals. The input signal may be amplified and/or filtered, for example, to remove intersymbol interference (ISI). ISI may be caused by high frequency amplitude and phase distortion which may "smear" the data bits at the receiving side. The techniques described herein include pseudo-differential common gate input buffer circuitry that include CTLE systems suitable for frequency gain and/or frequency suppression in the input buffer circuitry 200. For example, the input buffer circuitry 200 described herein may compensate for loss after a signal travels through a communication channel by restoring frequency content (e.g., via amplification) that may have been lost due to the communication channel attenuation, and further suppress certain frequencies where noise (e.g., noise amplification) may be of concern. Further, the pseudo-differential common gate input buffer circuitry 200 as depicted includes a common mode feedback bias (CMFB) structure or loop suitable for aiding in maintaining a common mode, as further described below.

In the depicted embodiment, an input signal incoming, for example, from a controller. such as the bank control 22, may be transmitted into the circuitry 200 via input node 202 to store data in the respective memory bank 12. Data to be stored may include high frequency (e.g., 6 Gbps or more) signals representative of logic high and/or logic low data, that may be transmitted via the communications channel 104. In the depicted embodiment, a continuous time linear equalizer (CTLE) circuit 206, 218 may process incoming high frequency signals (e.g., single ended signals) representative of binary data. The signals may have previously traveled through various interconnects inside a system to reach their destination (e.g., input buffer 200), so any electrical degradation induced at the transmitter, connectors, traces, cabling, and the receiver may have an effect on the timing and quality of the signal. For example, waveform distortions in the signal may be caused by impedance mismatches like stubs and vias, frequency dependent attenuation, and electromagnetic coupling between signal traces (e.g., crosstalk). Further, high speed signals moving through a channel may be subjected to high frequency impairments such as reflections, dielectric loss, and loss due to a skin effect. These impairments may degrade the quality of the signal making it more problematic for a receiver system (e.g., input buffer circuitry 200) to interpret the signal data correctly.

Accordingly, the incoming signals may be amplified and/or filter. In the depicted embodiment, a CTLE active inductor circuitry 206 may process the signals to increase a high frequency gain and/or to expand a bandwidth (e.g., direct current (DC) gain decreases and DC signal gain decreases). That is, the CTLE active circuit 206 may include components that behave as an inductor, with a resistive element 208 (e.g., resistor) coupled to a capacitive element 210 (e.g., capacitor) used to drive a switching device 212 (e.g., transistor). The CTLE active inductor circuitry 206 may also include a capacitive element 216 coupled to a drain of the switching device 212.

Three other CTL and/or active inductor circuits 218, 220, and 222 are shown, with respective resistive elements 224, 226, 228, capacitive elements 230, 232, 234, and switching devices 236, 254, 256. Also shown are capacitive elements 242, 244, 246, (e.g., load capacitors) included in the CTL and/or active inductor circuits 218, 220, and 222, respectively. A cross-coupled P-type metal-oxide-semiconductor (PMOS) circuitry 248 is included, for example, that may introduce positive feedback to increase signal gains, such as high transition signal gains. In the depicted embodiment, the cross-coupled PMOS circuitry 248 includes two switching devices 250, 252, cross-coupled with each other (e.g., via gate coupling). The switching device 250 may include a source and a drain connected to the CTLE active inductor circuit 206, while the switching device 252 may include a source and a drain connected to the CTLE active inductor circuit 218. The switching devices 250, 252 may thus be used to introduce positive feedback into the circuits 206 and 218 to increase an active inductor quality factor. It is to be noted that VSS may refer to a ground potential voltage, and VPERI may refer to a potential difference between a power supply potential and the ground potential VSS.

Switching devices 238 and 240 are depicted in a common gate (e.g., gate is connected to bias while the source serves as input and the drain serves as output) and in a common source configuration (gate is connected to input while the source is connected to ground and the drain serves as output), respectively. For ground reference signaling, the Vref signal is connected to VSS, and VSS termination resistors of 112 and 334 are used to control the common mode of the output signal. On the other hand, when using the Vref signal, the 334 resistors does not need to be connected. The Vref signal will be the middle level of Vih/Vil of the input.

Switching device 238 may amplify the input signal via node 202 while switching device 240 may amplify Vref through node 258. The signal swing at node 260 (e.g., Von node) may be smaller than at node 262 (e.g., Vop node), for example, due to the asymmetric signal amplification paths between switching devices 238 and 240. Accordingly, the pseudo-differential common gate input buffer circuitry 200 may include a common mode feedback (CMFB) loop that may aid in maintaining a common mode of xa and xb as center. That is, the CMFB loop may compare common mode voltages (e.g., longitudinal voltage or half-sum of the voltages) of $1^{st}$ stage and $2^{nd}$ stage outputs 266, 268 and regulate input bias branches (e.g., via gates of switching devices 272, 244) so that the $1^{st}$ stage output xa, xb is centered (e.g., by matching the output signal to a threshold such as an inverter threshold VDD/2). A resistor 334 (Rbot resistor) is also shown, which may be tuned to provide for a desired input referred offset.

The CMFB loop may include a CMFB amplification circuit 270 that may transfer signals to switching devices 272, 274, for example, via node 276. The CMFB circuit 270 may be used to keep the common mode of xa and xb nodes constant. Since the za,zb signals are the output signals of the inverter that performs full swing, it swings with VPERI/VSS. The center level of za/zb, zm, has a bias of VPERI/2 and serves as a reference. When the common mode of xa,xb signal rises, ym also rises, and cmfb voltage falls through 270 comparator. When the cmfb voltage falls, the current is increased through the 272, 274 PMOS, and the na3 and nb3 voltages rise. Eventually, the xa and xb signals are brought down to a constant level, and the common mode is kept constant through feedback. That is, the CMFB amplification circuit 270 may be coupled to gates of the input branch (e.g., node 202 branch) switching device 272 and voltage reference branch switching device 274 (e.g., Vref node 258 branch) of the circuitry 204 and then produce zm and ym signals which may be used, via zm node 278 and ym node 280, to provide for a common mode feedback bias used for outputs 266, 268 of output circuitry 282. The "loop" portion of the CMFB loop may refer to the connection between circuit 204 to circuit 282 (e.g., via nodes 284, 286), followed by a connection between circuit 282 and circuit 270 (e.g., via nodes 278, 280), and then from circuit 270 back to circuit 204 (e.g., via node 276).

Output circuitry 282 is connected to circuitry 204, and more specifically, to CTLE active inductor circuitry 206 and CTLE active inductor circuitry 218, via xa node 284 and xb node 286. Signals incoming to the output circuitry 282 via xa node 284 and xb node 286 may thus be amplified and filtered, as well as having a swing voltage of the output signals reduced via, for example, resistors 288, 290, 292, 294. More specifically, the output circuitry 282 includes switching devices 296, 298, coupled to the resistors 288, 292, switching devices 300, 302, coupled to the resistors 290, 294, switching devices 304, 306, coupled to the resistor 292, and switching devices 308, 310, coupled to the resistor 294, to provide for common mode processing of the xa and xb signals. Certain capacitance elements (e.g., capacitors) 312, 314, 316, and 318 may also be used in the output circuitry 282, suitable for storing charge and/or filtering signals.

As mentioned above, the CMFB amplification circuit 270 may use feedback to provide for a common mode feedback bias. In the illustrated embodiment, switching devices 322, 324 are coupled (e.g., drain coupled) via a positive feedback loop, while switching devices 326, 328 are coupled (e.g., source coupled) via a negative feedback loop. Switching devices 322, 328 are coupled to each other via source and drain, while switching devices 324, 326 are coupled to each other also via source and drain. The CMFB amplification circuit 270 may also include switching devices 330, 332, which may be coupled to each other via their respective gates. The gates of the switching devices 330, 332 may be coupled to source and drain of the switching devices 322, 328. The source of the switching device 330 may be coupled to drains of the switching devices 322, 324, while the drain of the switching device 332 may be coupled to sources of the switching devices 326, 328. The CMFB amplification circuit 270 may compare the common mode signals of zm and ym nodes, and when ym is low, (e.g., representative of when xa, xb signals are low), the CMFB bias is compared and raised, and na3 and nb3 node signals are lowered accordingly (e.g., so that xa, xb signals are raised to compensate). In this manner, the CMFB amplification circuit 270 may process signals to regulate outputs 266, 268, for example.

As a high level summary of the pseudo-differential common gate input buffer circuitry 204, differential input signal amplification may be provided via the switching devices 206, 218, resulting in differential signals xa, xb. CTLE processing for the signals xa, xb, may be provided via active induction circuitry, such as circuitry 206, 218, which may be coupled via the cross-coupled PMOS circuitry 248. The cross-coupled PMOS circuitry 248 may provide for increase in gain of xa and xb, and respective output signals 266, 268. Cross-coupled circuits 220, 222, may provide for biasing (e.g., selecting a desired current flow) of the amplification switching devices 238, 240. The CMFB amplification circuit 270 may aid in biasing the amplification switching devices 272, 274 and in providing for a better match of the output signal to a threshold, such as VDD/2.

In some cases, the CMFB loop (e.g., CMFB amplification circuit 270 and/or certain components connected to the CMFB amplification circuit 270) may not be desired. For example, some "corner" conditions, such as large duty cycle variations, large current variations, and so on, may result in the circuit's PVT conditions not being as desired. Accordingly, the techniques described herein include an embodiment of a pseudo-differential common gate input buffer circuitry that has the CMFB loop removed, as shown in FIG. 4.

Figure 4:
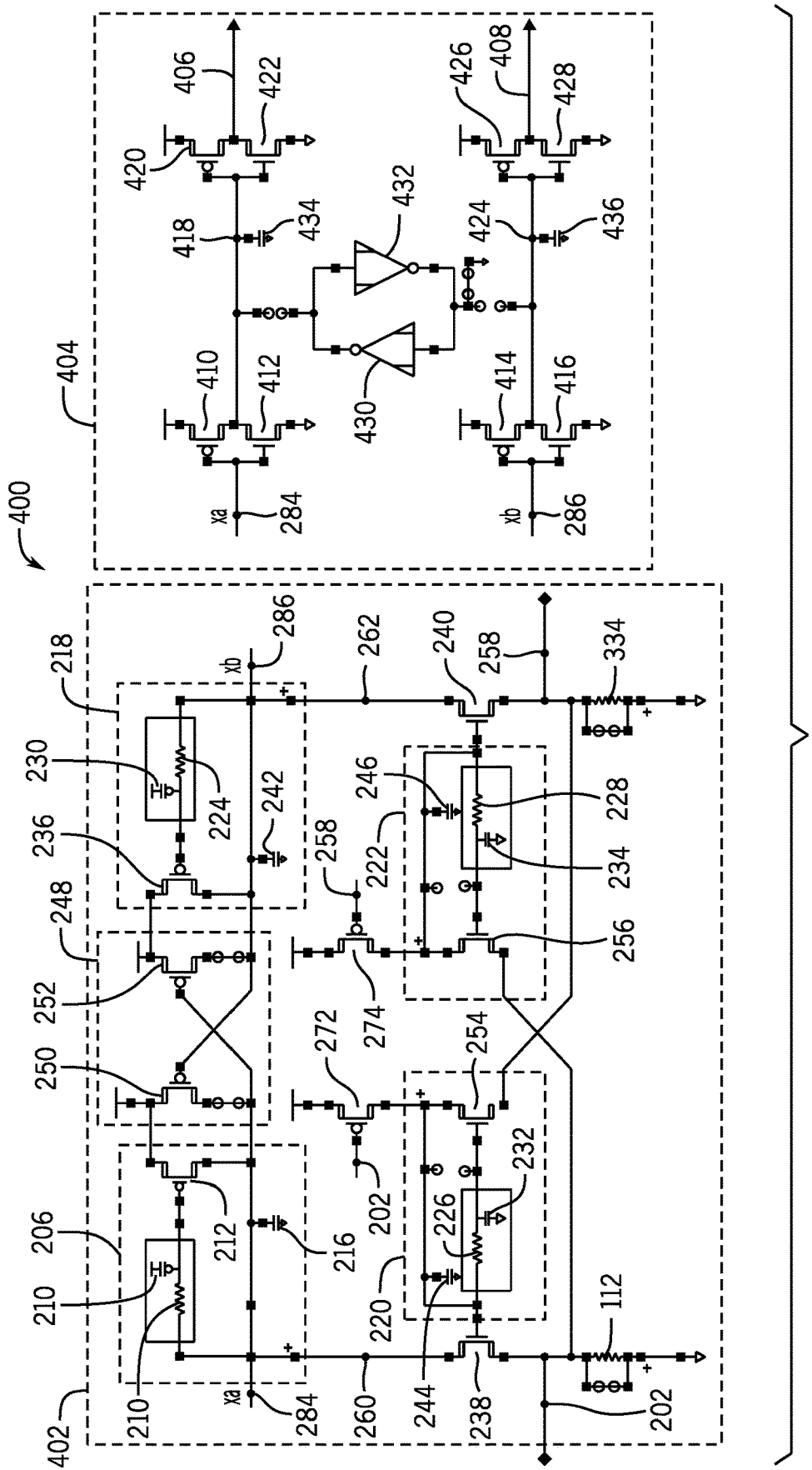
FIG. 4 is a circuit diagram of a pseudo-differential common gate input buffer that does not include a common mode feedback (CMFB) loop, in accordance with an embodiment.

FIG. 4 is a schematic diagram illustrating an embodiment of a pseudo-differential common gate input buffer circuitry 400 that may not include a CMFB loop. Because the illustrated embodiment includes some of the same components as those shown in FIG. 3, the components are numbered using the same element numbers. As in the pseudo-differential common gate input buffer circuitry 200 of FIG. 3, input node 202 may receive incoming signals so store data in the memory bank 12. Switching device 238 may amplify input signals for a first branch (e.g., node 260 branch) while switching device 240 may amplify signals for a second branch (e.g., node 262 branch) of a circuit 402. CTLE processing for the signals xa, xb, may be provided via active induction circuitry, such as circuitry 206, 218, which may be coupled via the cross-coupled PMOS circuitry 248. The cross-coupled PMOS circuitry 248 may provide for increase in gain of xa and xb. Cross-coupled circuits 220, 222, may provide for biasing (e.g., selecting a desired current flow) of the amplification switching devices 238, 240.

The circuit 402 is substantially similar to the circuit 204 with certain minor variations. For example, switching devices 272, 274 are no longer connected to the CMFB amplification circuit 270 because the CMFB amplification circuit 270 is no longer present. Instead, a gate of switching device 272 may now be coupled to input node 202, and a gate of switching device 274 may be coupled to node 258 (e.g., VREF node). Additionally, the "loop" portion of the circuit 204 is no longer present as circuits 402, 404 are connected at nodes 286, 286 instead of in a loop fashion.

Circuit 404 may be an inverter circuit and include outputs 406 and 408. The circuit 404 (e.g., common source structure) may provide a higher gain than the biasing circuit of the previous CMFB to increase a voltage swing of 284, 286 signals by removing resistance. The common mode of the input signal at node 202 and VREF signal at node 258 may control the current mirror for more stable operations. As the bias of the NA3 node and NB3 node decreases, the current of the common gate of switching devices 238, 240 decreases correspondingly. So unlike previous circuits, it consumes a stable current and operates with improved stability. By applying the common source structure 404, the gain of the xa and xb nodes 284, 286 may be higher when compared to the gain of the circuit 200 of FIG. 3. Further, a timing between the exiting xa and xb timings may have been further improved when compared to the circuit 200 of FIG. 3.

In the depicted embodiment, node xa 284 may be coupled to gates of switching devices 410 and 412, thus controlling the sources of the switching devices 410, 412. Likewise, node xb 286 may be coupled to gates of switching devices 414, 416, thus controlling the sources of the switching devices 414, 416. Node za 418 (e.g., common mode node that may be used for common mode processing) is shown as connected to gates of switching devices 420, 422. Node zb 424 (e.g., common mode node that may be used for common node processing) is shown as connected to gates of switching devices 426, 428.

Inverters 430, 432 are also shown. The inverters 430, 432 may be used to couple the za node 418 branch (e.g., first or top branch) of the circuit 404 to the zb node 424 branch (e.g., second or lower branch). Capacitance elements 434, 436 are also shown. By providing for the pseudo-differential common gate input buffer circuitry 400, the techniques described herein may discard the use of a CMFB loop and improve gain, duty cycles, and more generally, enable improved PVT characteristics for the memory device 10. In the CMFB circuit, the 282 circuit is an inverter circuit, and za, zb nodes and 266, 268 nodes are full swing signals. Therefore, it is the xa and xb signals that improve the common mode due to the feedback loop, and 266 and 268 may not have an effect. Also, maintaining a constant current is the role of the 402 circuit, and the 406,408 output signals are not related. The CMFB output signal is not used in the circuit 400 of FIG. 4 and the in/vref signal has a similar effect to the CMFB output signal by connecting the in/vref signal to the PMOS (e.g., 272, 274). For ground reference signaling, the Vref may not be used and VSS termination of resistors 112 and 334 are then used to control the common mode of the output signal.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A memory device, comprising:
a common gate input buffer circuit, comprising:
an input node configured to receive a signal representative of data to be stored in the memory device;
a voltage reference node configured to receive a reference signal representative of a voltage reference;
an amplification circuit electrically coupled to the input node and to the voltage reference node and configured to amplify the signal to provide for an amplified signal;
an equalization circuit electrically coupled to the amplification circuit and configured to process the amplified signal to provide for a filtered signal; and
an output circuit electrically coupled to the equalization circuit and configured to provide for at least one output signal based on the filtered signal, wherein the output signal comprises a differential output signal and wherein the common gate input buffer circuit does not include a common mode feedback (CMFB) loop, wherein the output circuit comprises a second switching device comprising a second gate electrically coupled to the common mode node and a source configured to provide the differential output signal.

2. The memory device of claim 1, wherein the amplification circuitry comprises a first and a second switching device, wherein the first switching device comprises a first source electrically coupled to the input node, the second switching device comprises a second source electrically coupled to the voltage reference node, and wherein the first switching device amplifies input node signals and the second switching device amplifies voltage reference signals.

3. The memory device of claim 2, wherein a drain of the first switching device is electrically coupled to the equalization circuit to provide the amplified signal to the equalization circuit.

4. The memory device of claim 3, wherein a gate of the first switching device is electrically coupled to a cross-coupled bias circuit to bias the first switching device to provide a desired current.

5. The memory device of claim 1, wherein the equalization circuit comprises a continuous time linear equalizer (CTLE) circuit.

6. The memory device of claim 5, wherein the CTLE circuit comprises a first active induction circuit electrically coupled to a second active induction circuit via a cross-coupled P-type metal-oxide-semiconductor (PMOS) circuit.

7. The memory device of claim 1, wherein the output circuit comprises a first switching device configured to increase an output signal current of the at least one output signal based on a low swing voltage of the filtered signal.

8. The memory device of claim 7, wherein the first switching device comprises a first gate electrically coupled to the equalization circuit and configured to amplify the filtered signal and a source electrically coupled to a common mode node.

9. A common gate input buffer circuit, comprising:
an input node configured to receive a signal representative of data;
a voltage reference node configured to receive a reference signal representative of a voltage reference;
an amplification circuit electrically coupled to the input node and to the voltage reference node and configured to amplify the signal to provide for an amplified signal;
an equalization circuit electrically coupled to the amplification circuit and configured to process the amplified signal to provide for a filtered signal; and
an output circuit electrically coupled to the equalization circuit and configured to provide for at least one output signal based on the filtered signal, wherein the output signal comprises a differential output signal, and wherein the output circuit comprises a first switching device configured to increase an output signal current of the at least one output signal based on a low swing voltage of the filtered signal.

10. The circuit of claim 9, wherein the first switching device comprises a first gate electrically coupled to the equalization circuit and configured to amplify the filtered signal and a source electrically coupled to a common mode node.

11. The circuit of claim 10, wherein the first switching device is disposed in a first branch of the output circuit configured to receive the filtered signal and to provide the differential output signal.

12. The circuit of claim 11, wherein the output circuit comprises a second branch disposed in parallel with the first branch and configured to receive a second filtered signal based on the voltage reference and to provide a second differential output.

13. The circuit of claim 12, wherein the first branch is electrically coupled to the second branch via two inverters having polarities opposite from each other.

14. The circuit of claim 9, wherein the equalization circuit comprises a continuous time linear equalizer (CTLE) circuit and wherein the reference signal comprises a ground referenced signal (GRS).

15. A memory device, comprising:
a common gate input buffer circuit, comprising:
an input node configured to receive a signal representative of data to be stored in the memory device;
a voltage reference node configured to receive a reference signal representative of a voltage reference;

an amplification circuit electrically coupled to the input node and to the voltage reference node and configured to amplify the signal to provide for an amplified signal;

an equalization circuit electrically coupled to the amplification circuit and configured to process the amplified signal to provide for a filtered signal; and an output circuit electrically coupled to the equalization circuit and configured to provide for at least one output signal based on the filtered signal, wherein the output signal comprises a differential output signal, and wherein the output circuit comprises a first switching device configured to decrease an output signal current of the at least one output signal based on a high swing voltage of the filtered signal.

16. The memory device of claim 15, wherein the common gate input buffer circuit does not include a common mode feedback (CMFB) loop.

17. The memory device of claim 15, wherein the equalization circuit comprises a continuous time linear equalizer (CTLE) circuit having a first active induction circuit electrically coupled to a second active induction circuit via a cross-coupled P-type metal-oxide-semiconductor (PMOS) circuit.

18. The memory device of claim 15, wherein the first switching device comprises a first gate electrically coupled to the equalization circuit and configured to amplify the filtered signal and a source electrically coupled to a common mode node.

19. The memory device of claim 15, wherein the first switching device is disposed in a first branch of the output circuit configured to receive the filtered signal and to provide the differential output signal, and wherein the output circuit comprises a second branch disposed in parallel with the first branch and configured to receive a second filtered signal based on the voltage reference and to provide a second differential output.

* * * * *